United States Patent
Law

(10) Patent No.: US 7,867,816 B2
(45) Date of Patent: Jan. 11, 2011

(54) METHOD AND SYSTEM FOR INNOVATIVE SUBSTRATE/PACKAGE DESIGN FOR A HIGH PERFORMANCE INTEGRATED CIRCUIT CHIPSET

(75) Inventor: Edmund Law, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 80 days.

(21) Appl. No.: 11/409,107

(22) Filed: Apr. 24, 2006

(65) Prior Publication Data

US 2007/0158846 A1 Jul. 12, 2007

Related U.S. Application Data

(60) Provisional application No. 60/752,592, filed on Dec. 22, 2005.

(51) Int. Cl.
*H01L 21/00* (2006.01)

(52) U.S. Cl. .................. 438/106; 438/107; 438/118; 438/123; 257/700; 257/766; 257/774; 257/633; 257/632; 361/794; 361/77; 361/778

(58) Field of Classification Search ................. 257/758, 257/700, 766, 774, 633, 632; 438/106, 107, 438/118, 123; 361/794, 77, 778
See application file for complete search history.

(56) References Cited

U.S. PATENT DOCUMENTS

| | | | | |
|---|---|---|---|---|
| 5,966,294 A | * | 10/1999 | Harada et al. | 361/794 |
| 2003/0149942 A1 | * | 8/2003 | Hsu | 716/1 |
| 2004/0183167 A1 | * | 9/2004 | Hortaleza et al. | 257/666 |
| 2005/0121771 A1 | * | 6/2005 | Lin et al. | 257/700 |
| 2005/0133255 A1 | * | 6/2005 | Conner et al. | 174/261 |
| 2005/0235233 A1 | * | 10/2005 | Hsu | 716/1 |
| 2006/0157826 A1 | * | 7/2006 | Lee et al. | 257/635 |

* cited by examiner

*Primary Examiner*—Mary Wilczewski
*Assistant Examiner*—Telly D Green
(74) *Attorney, Agent, or Firm*—Sterne, Kessler, Goldstein & Fox P.L.L.C.

(57) ABSTRACT

Provided is a method and system for designing an integrated circuit (IC) substrate, the substrate being formed to include at least one die. The method includes providing at least portions of IC power and a grounding function on a metal 2 substrate layer and utilizing all of a metal 3 substrate layer for the grounding function. Portions of the metal 2 layer and a metal 4 layer are utilized for the IC power, wherein all of the IC power is centralized underneath the die.

8 Claims, 11 Drawing Sheets

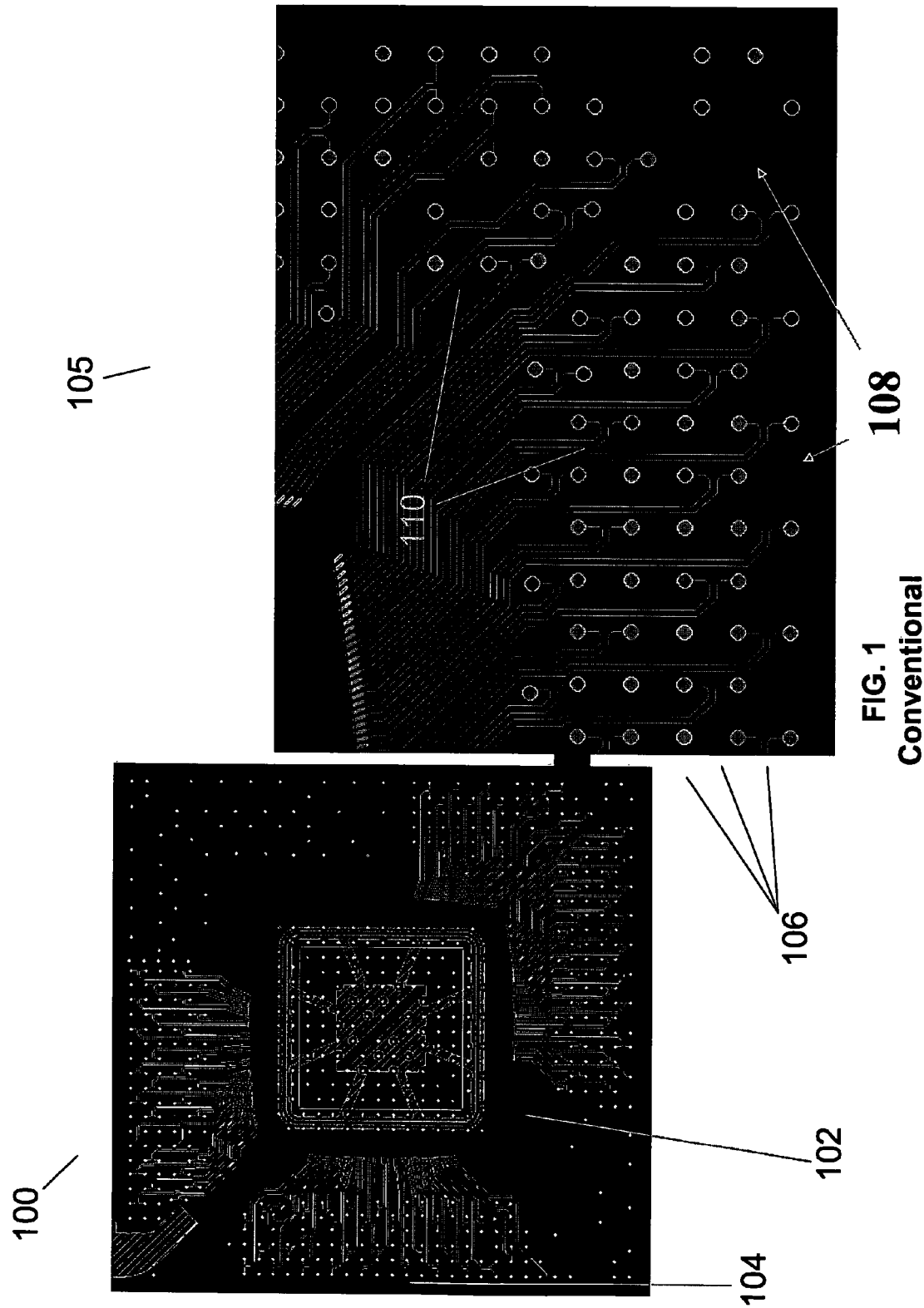
FIG. 1
Conventional

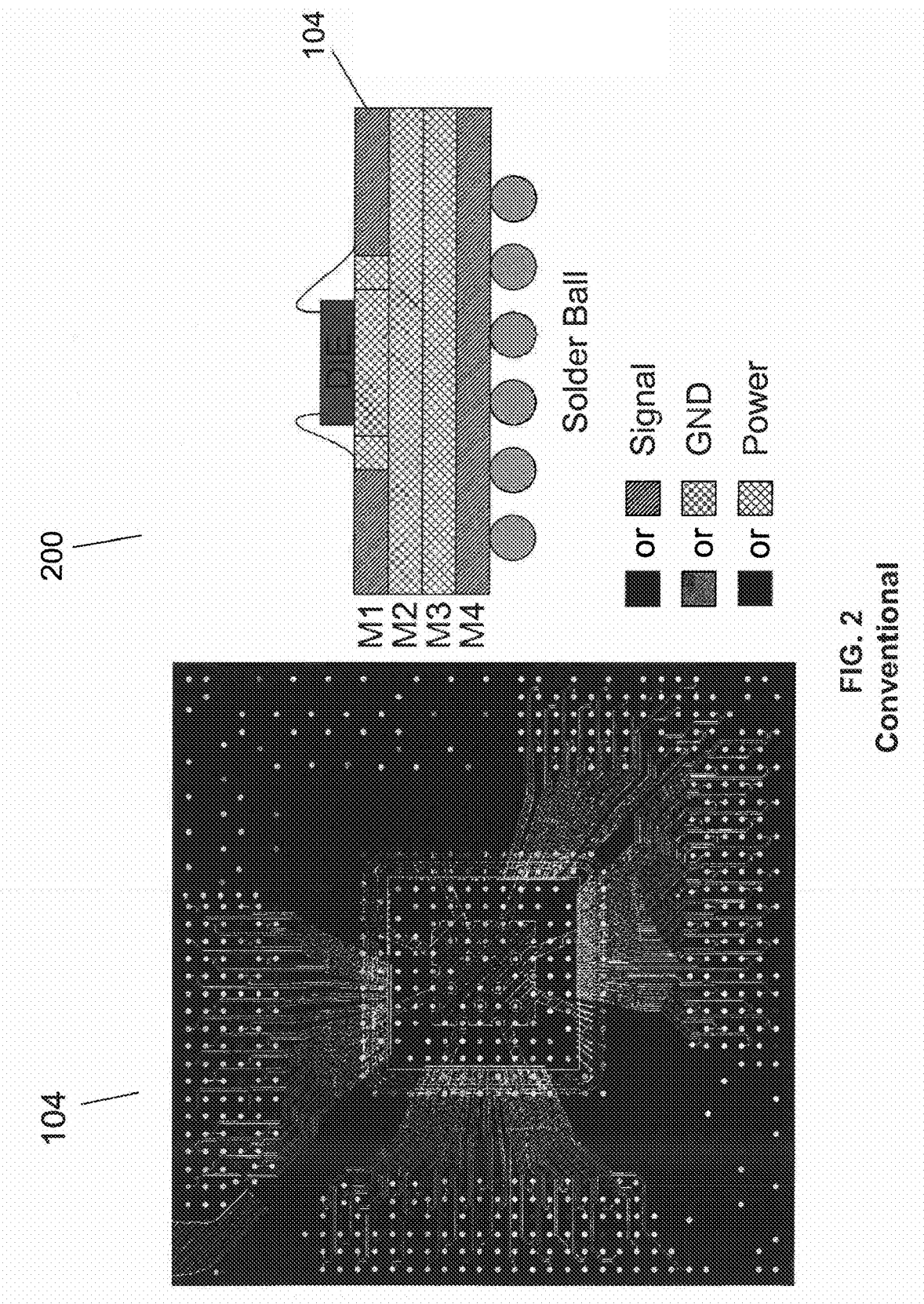
FIG. 2
Conventional

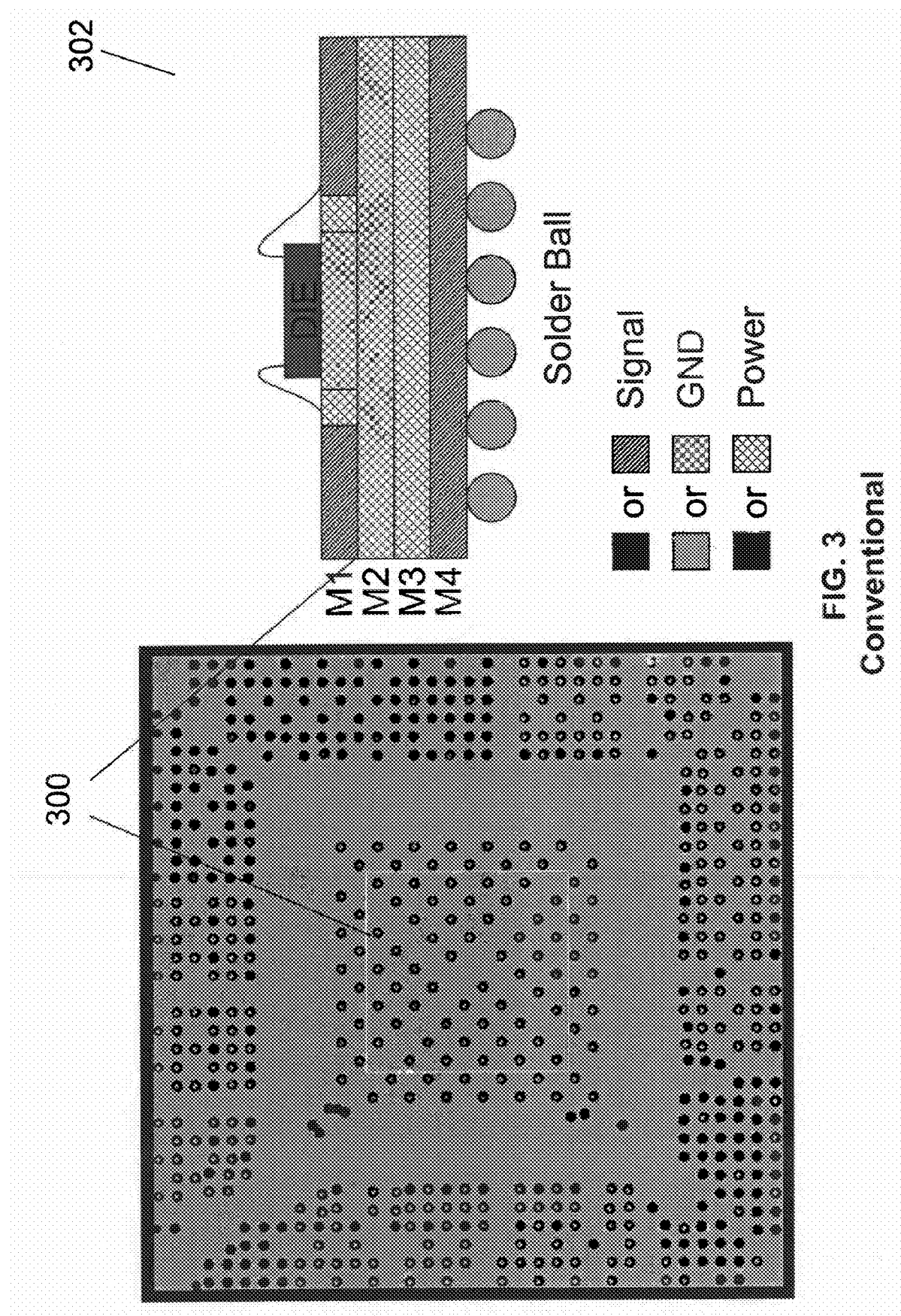
FIG. 3
Conventional

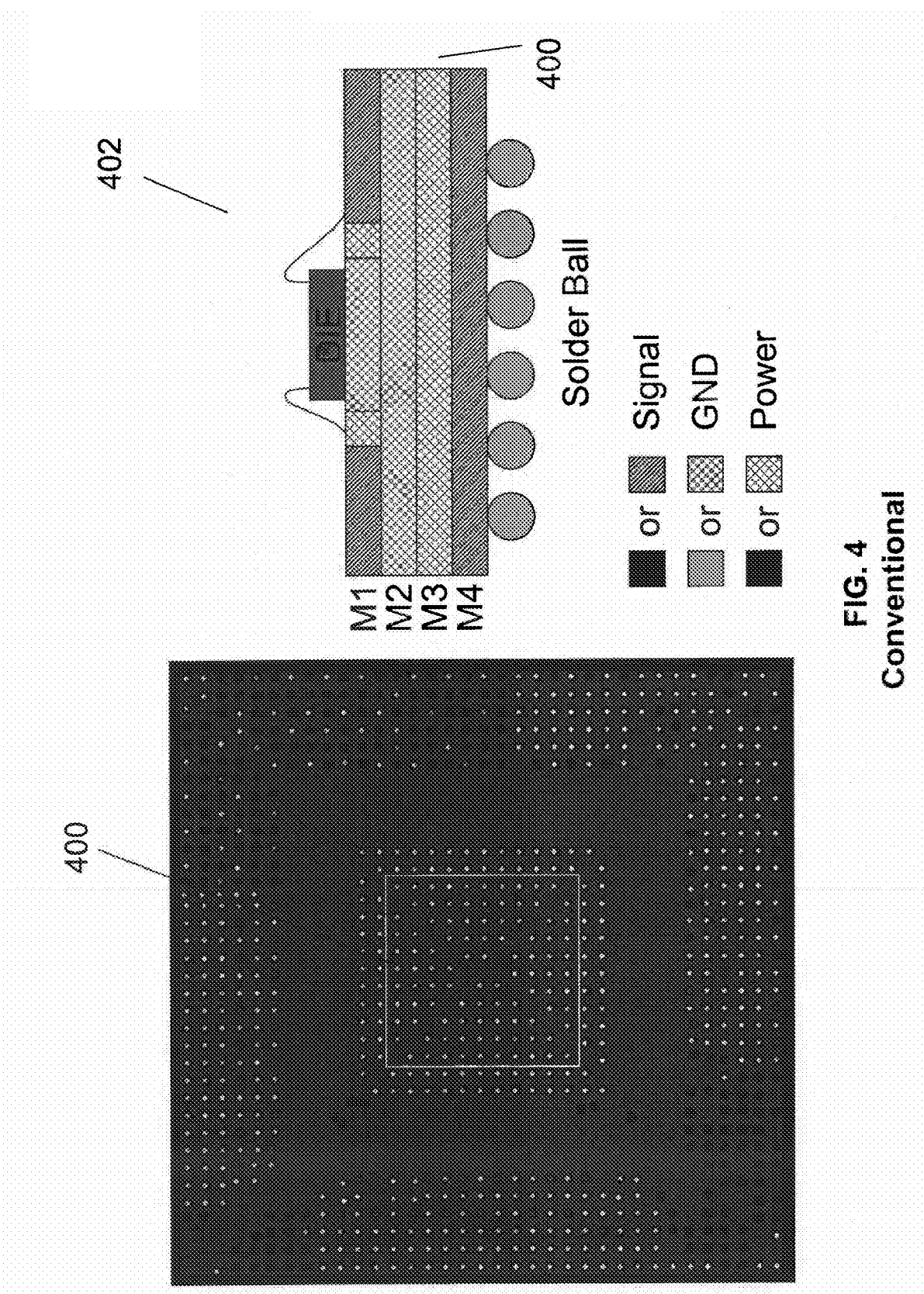
FIG. 4
Conventional

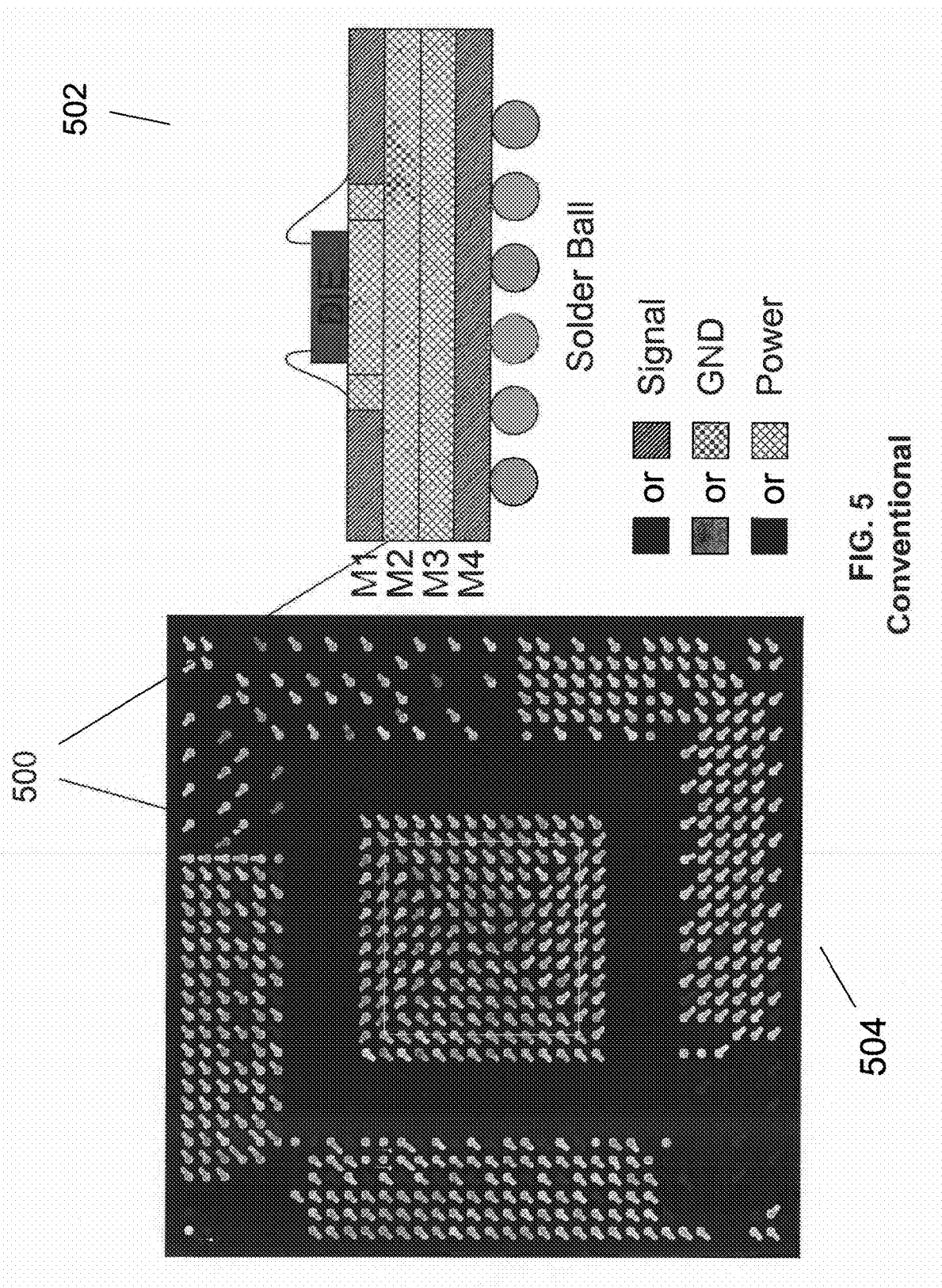
FIG. 5
Conventional

METHOD AND SYSTEM FOR INNOVATIVE SUBSTRATE/PACKAGE DESIGN FOR A HIGH PERFORMANCE INTEGRATED CIRCUIT CHIPSET

CROSS-REFERENCE TO RELATED APPLICATIONS

This application claims benefit to U.S. Provisional Application No. 60/752,592, filed on Dec. 22, 2005, entitled "Method and System for Innovative Substrate/Package Design for a High Performance Integrated Circuit Chipset" which is incorporated by reference herein in its entirety.

BACKGROUND OF THE INVENTION

1. Field of the Invention

The present invention relates generally to packaging of substrates for integrated circuits (ICs).

2. Background Art

Traditional high speed substrate packaging can include high speed differential pair circuits routed on a metal 1 (M1) layer, metal 2 (M2) layer ground (GND), and metal 3 (M3) layer power (PWR) type structure. A metal 4 (M4) layer, in traditional substrate packaging, includes only ball pads, or signal. More specifically, power and GND balls are typically placed in the areas around the high speed differential pairs. However, achieving higher speeds from these traditionally packaged ICs (e.g., 1 giga-hertz (GHz) or greater) is problematic.

Using the traditional substrate packaging structure noted above, the standard M4 layers cannot support the performance of higher speed chip applications. This is due, in part, to too many differential routes on the same layer, poor distribution of analog and core power, a need to increase package size to accomplish all differential pairs, and cross coupling between power and signal lines within the same block/layer.

What is needed, therefore, is a method and system to ameliorate the challenges of the traditional IC packaging. More particularly, what is needed is an IC packaging system and method for accommodating higher speed differential pair circuit applications.

BRIEF SUMMARY OF THE INVENTION

Consistent with the principles of the present invention as embodied and broadly described herein, the present invention includes a method for designing an integrated circuit (IC) substrate, the substrate being formed to include at least one die. The method includes providing at least portions of IC power and a grounding function on a metal 2 substrate layer and utilizing all of a metal 3 substrate layer for the grounding function. Portions of the metal 2 layer and a metal 4 layer are utilized for the IC power, wherein all of the IC power is centralized underneath the die.

The present invention offers advantages including high speed differential pairs routed on the M1 and M4 layers with only GND balls around the high-speed pairs. The M2 layer (GND) includes embedded VDDC, the M3 layer (GND) includes embedded analog power, and the M4 layer has ball pads as well as different analog and core power planes. Additionally, the analog and core power paths are allocated in the center of the substrate—creating a very direct path into and out of the package. The technique of the present invention facilitates higher signal speeds within the differential pair circuits by reducing, among other things, cross-talk between the signal lines and the device power. Additional advantages of the present invention include substrate space saving based upon routing of the differential pairs on M1 and M4, more direct allocation of analog and core power (with a 4 layer BT substrate), reduction in overall package size and cost, and minimization of coupling between differential pairs on the top layer (M1) and the bottom layer (M2).

As an example of reduction in overall package size, consider a package originally including a 40×40 4 layer plastic ball grid array (PBGA)+heat sink (HS) or 35×35 6-8 layer Flip chip BGA. By utilizing the substrate design techniques of the present invention, this package size can be reduced to a 35×35 4 layer PBGA+HS. This reduction is equivalent to a savings of two package sizes, in addition to providing higher package performance. By utilizing the present invention, cost effective substrate packaging can be implemented for many high-end high speed devices used in applications such as cable television, switching, and computer network servers.

Further features and advantages of the present invention as well as the structure and operation of various embodiments of the present invention, are described in detail below with reference to the accompanying drawings.

BRIEF DESCRIPTION OF THE DRAWINGS/FIGURES

The accompanying drawings, which are incorporated herein and constitute part of the specification, illustrate embodiments of the present invention and, together with the general description given above and the detailed description of the embodiments given below, serve to explain the principles of the invention. In the drawings:

FIG. 1 is an illustration of a traditional integrated circuit (IC) substrate packaging technique;

FIG. 2 is an illustration of an M1 layer of the conventional IC substrate shown in FIG. 1;

FIG. 3 is an illustration of an M2 layer of the conventional IC substrate shown in FIG. 1;

FIG. 4 is an illustration of an M3 layer of the conventional IC substrate shown in FIG. 1;

FIG. 5 is an illustration of an M4 layer of the conventional IC substrate shown in FIG. 1;

DETAILED DESCRIPTION OF THE INVENTION

Figure 6:
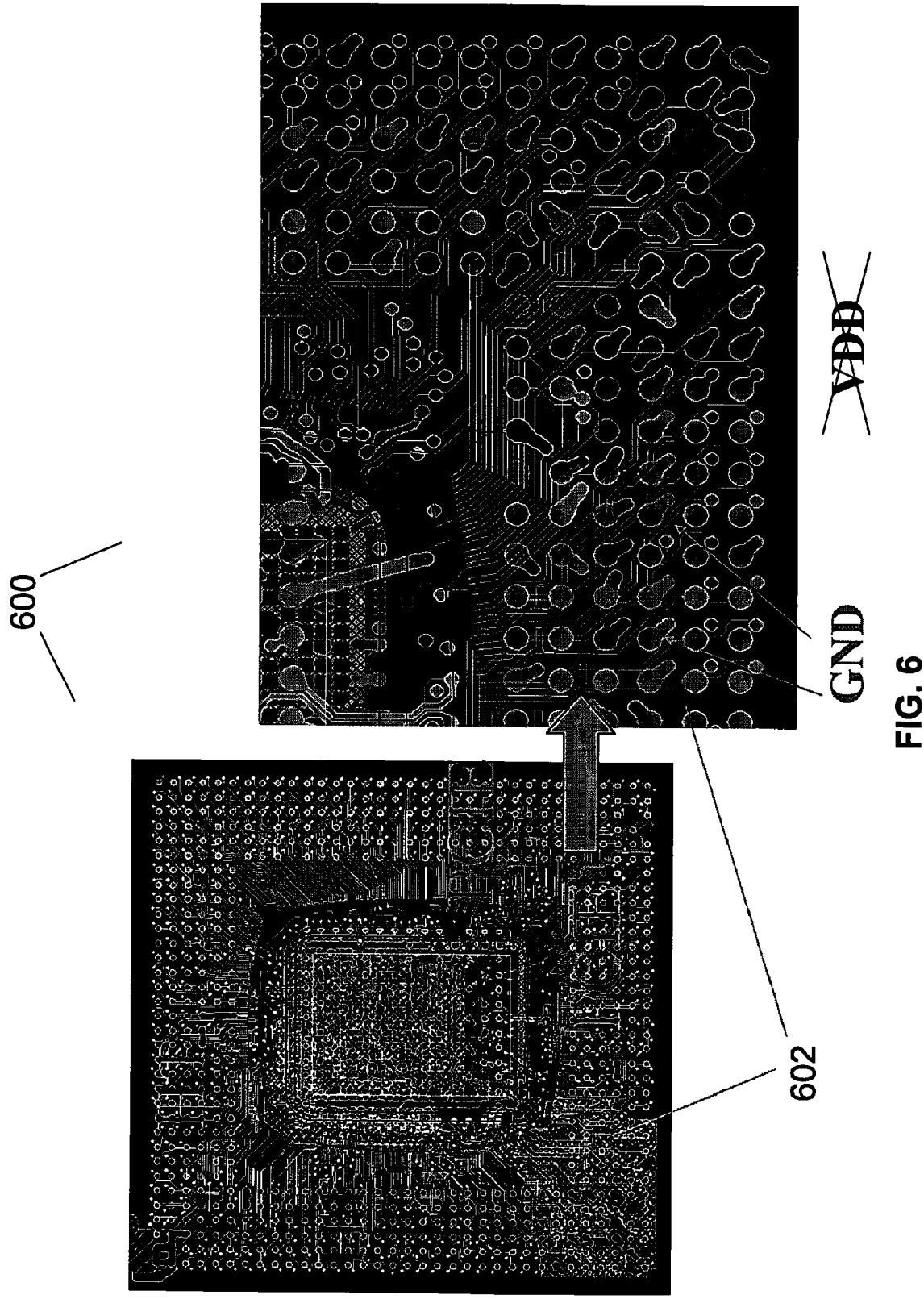
FIG. 6 is an illustration of an IC substrate packaging technique in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 is an illustration of an integrated circuit (IC) substrate 100 using a traditional substrate packaging technique. With an increasing number of input/outputs (I/Os) and higher data rate signal transfers in semiconductors, there is an increased requirement for larger package sizes, more I/O on package pin outs, multiple layers for plane isolation, and different power consumption capabilities. In order to fulfill the increased requirements, very high-end substrates (e.g., over 6 to 8 layers) and very expensive substrates have traditionally been used. FIG. 1 is an example of one of these traditional approaches.

The structure of FIG. 1 includes a number of high speed differential circuits. In FIG. 1, all differential pair circuits 102 are routed on an M1 layer 104, with power and GND balls next to the pairs. This structure employs standard signal, ground, and power, signal substrate layering techniques. In FIG. 1, an expanded view 105 is provided. In the expanded view 105, connections 106 shown are the differential pair circuits. Vdd connections 108 and GND connections 110 are indicated as shown. This approach will not ensure sufficient isolation for all of the differential pair circuits 102. That is, placing power and ground around the differential pair circuits leaves an insufficient amount of space on the IC to combine and centralize power potentials. Furthermore, the traditional approach, using power and ground together, as illustrated in FIG. 1, does not provide adequate space to route an adequate number of high speed signal lines.

FIG. 2 is a cross-sectional view 200 of the M1 layer 104 within the conventional IC substrate 100 shown in FIG. 1. The cross-sectional view 200 of FIG. 2 indicates that the M1 layer 104 of traditional substrate includes signal, ground, and power components.

FIG. 3 is an illustration of an M2 layer 300 of the conventional IC substrate 100 shown in FIG. 1. A cross-sectional view 302 in FIG. 3 indicates that the M2 layer of traditional substrates is used exclusively for grounding.

FIG. 4 is an illustration of an M3 layer 400 within the conventional IC substrate 100 shown in FIG. 1. A cross-sectional view 402 in FIG. 4 indicates that the M3 layer of traditional substrates is used exclusively for power.

FIG. 5 is an illustration of an M4 layer 500 of the conventional IC substrate 100 shown in FIG. 1. A cross-sectional view 502 in FIG. 5 indicates that the M4 layer of traditional substrates is all signal. More particularly, the M4 layer 500 basically ball pads (i.e., no plane and no routing). That is, the M4 layer 500 has essentially no power and no ground. Also in FIG. 5, there are no signal lines on the bottom portion 504, shown in the plane view on the left. Only ball pads are visible in the plane view.

FIG. 6 is an illustration of an IC substrate 600 that embodies a packaging technique 602 in accordance with an embodiment of the present invention. In the present invention, a more cost effective packaging technique is used. In the present invention, instead of using the traditional M1-M4 structure of signal, ground, power, signal, the present invention centralizes the supply power and core power underneath the die.

For example, in the present invention, all of the high speed differential pair circuits are located on M1 and M4 layers (illustrated more clearly below) as opposed to the power and ground structure of the conventional techniques, such as those illustrated in FIGS. 1-5. In the present invention, power and ground are kept away from the differential pairs, thus minimizing cross-talk. The approach of the present invention saves cost by eliminating the requirement of large packaging. This approach also provides significant space savings.

More specifically, by running differential pair circuits on M1 and M4, more substrate real estate is freed up to run corresponding differential signals. In the present invention, an M2 layer is a combination of the Vdd core on the center, and ground. In the conventional substrate, such as the substrate 100 illustrated in FIG. 2, the M3 layer is used for power. The present invention, however, uses a mixed layer having power and ground on same layers, such as M1 and M2. In the present invention, high speed transmit differential pair circuits are placed on the M1 layer. Receive high speed (e.g. over 1 GHz) differential pair circuits are placed on the M4 layer.

In FIG. 6, power is centralized beneath the die (i.e., on the area of the substrate that supports the die). In this manner, power need not be used on the substrate 600 in areas where grounds are also used.

Placing all of the differential pairs on the M1 layer, as done in conventional structures, creates congestion that leads to cross-talk. In the present invention, however, by putting transmit differential pairs on the top and receive differential pairs on the bottom, cross talk can be reduced. In FIG. 6, only ground is next to the differential pairs. Additionally, the present invention uses a signal, ground, ground, signal structure. This structure facilitates faster speeds because of less coupling between power and signal lines.

Figure 7:
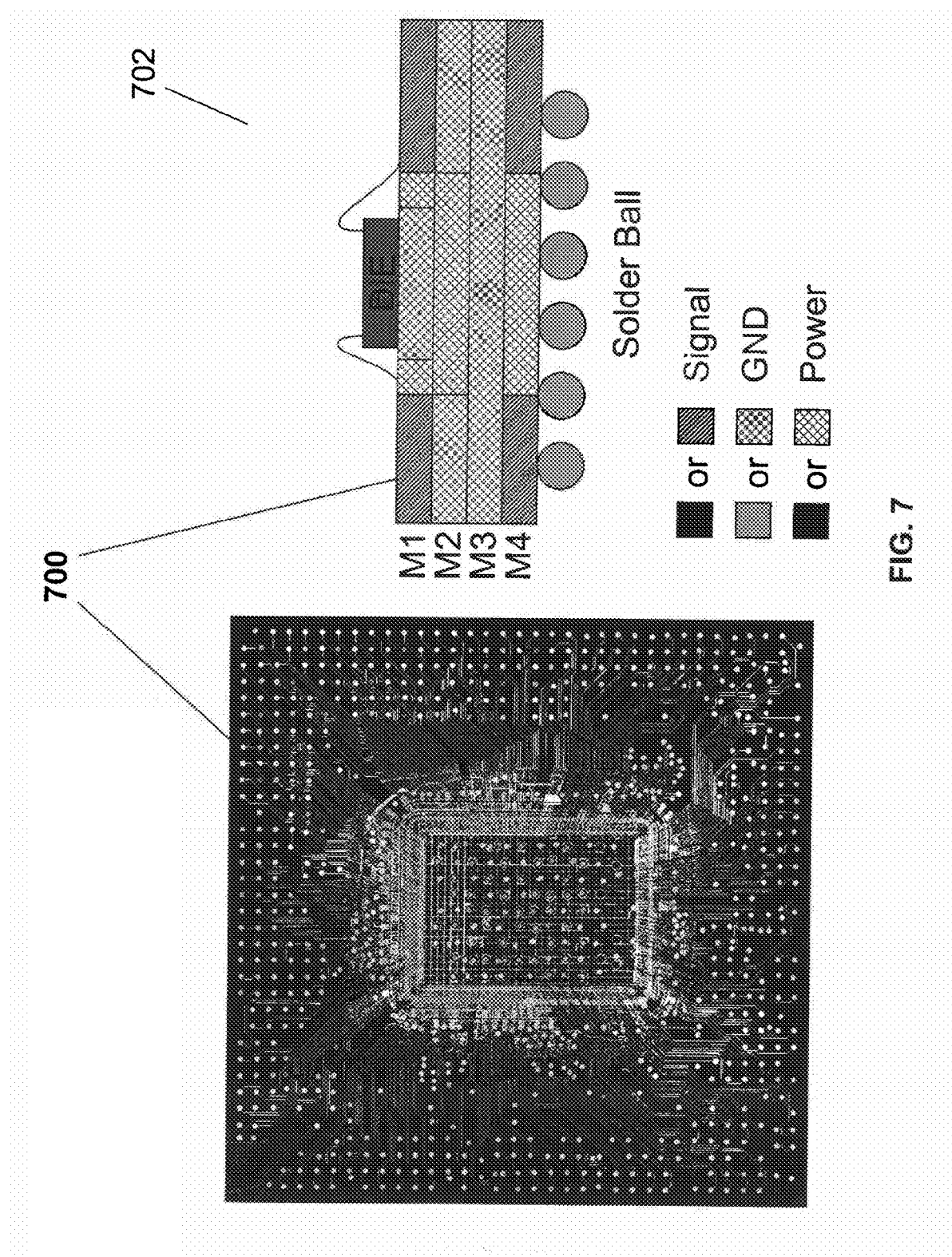
FIG. 7 is an illustration of the M1 layer of the IC substrate shown in FIG. 6 in accordance with the present invention.

FIG. 7 is a more detailed illustration of an M1 layer 700 within the IC substrate 600 shown in FIG. 6 in accordance with the present invention. A cross sectional view 702 of FIG. 7 indicates that the M1 layer 700 includes a combination of signal, some power (i.e., because power is centralized), and ground. In order to centralize all of the supply power (i.e., beneath the die), a portion of the ground plane must be utilized.

Figure 8:
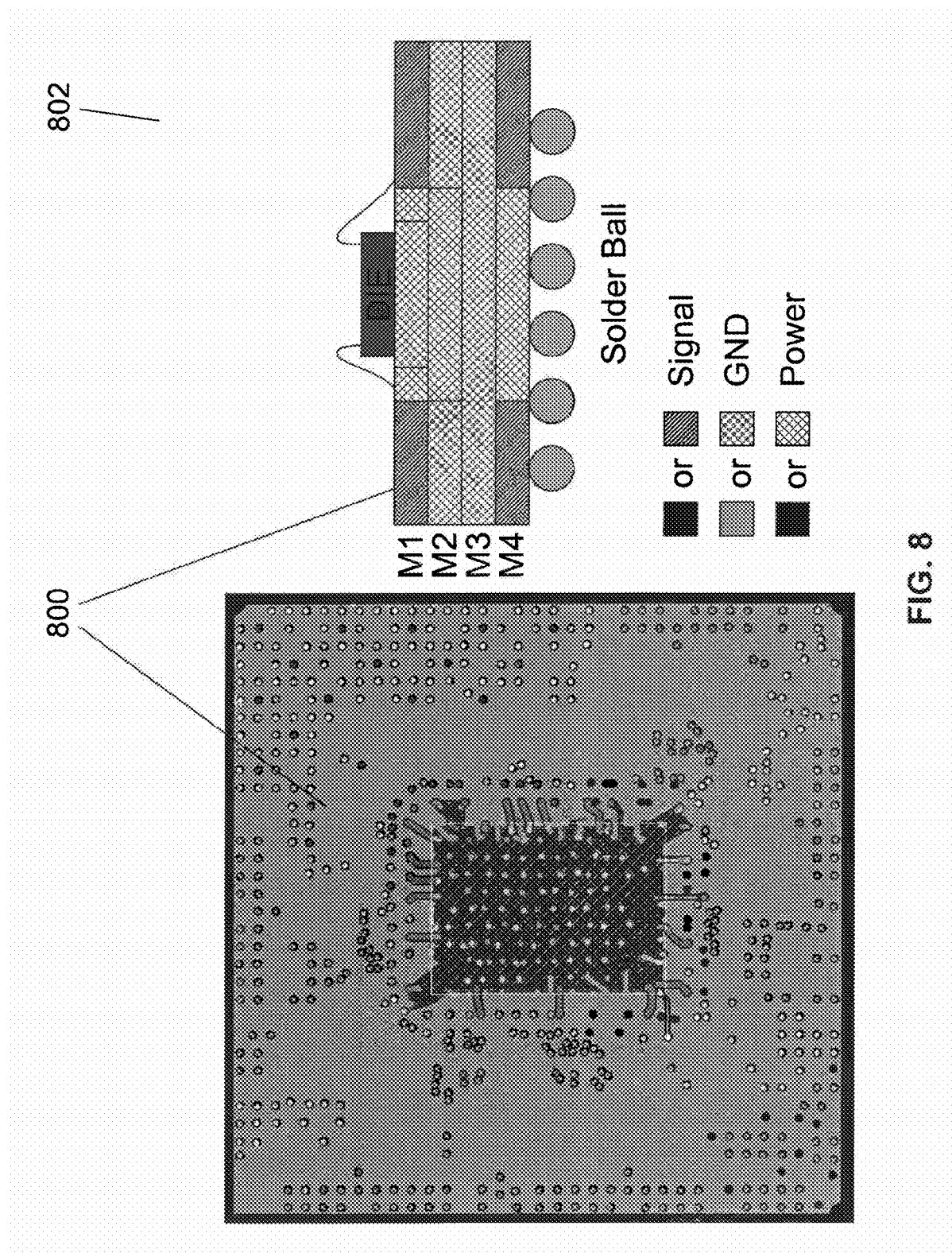
FIG. 8 is an illustration of the M2 layer of the IC substrate shown in FIG. 6 in accordance with the present invention.

FIG. 8 is an illustration of an M2 layer 800 within the IC substrate 600 shown in FIG. 6 in accordance with the present invention. A cross-sectional view 802 of FIG. 8 indicates that the M2 layer 800 is part power and part ground. The M2 layer 800 is also power in order to facilitate the centralized power concept. In the conventional substrate structure (see for example, FIG. 2), the M2 layer is all ground.

Figure 9:
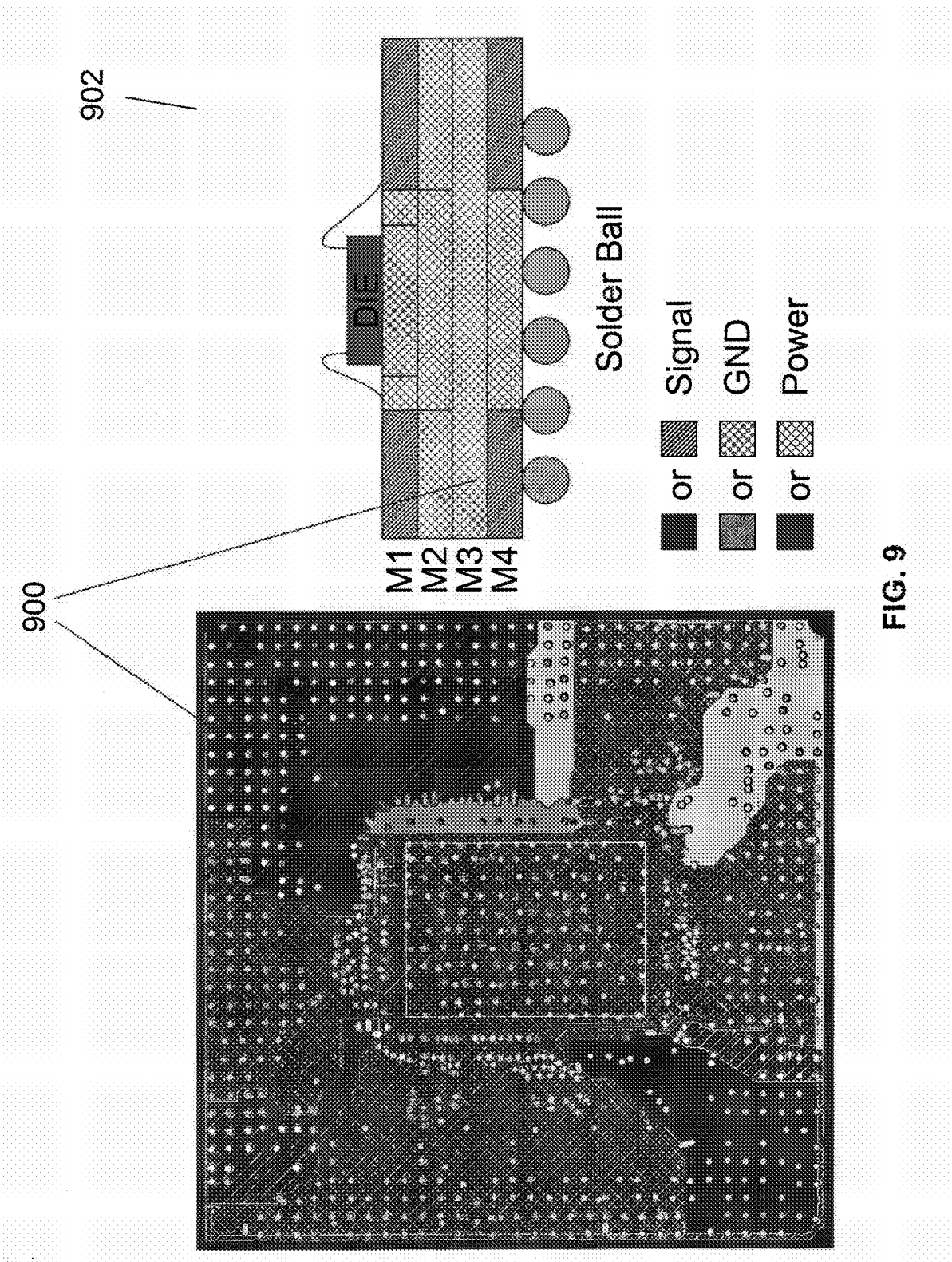
FIG. 9 is an illustration of the M3 layer of the IC substrate shown in FIG. 6 in accordance with the present invention.

FIG. 9 is an illustration of an M3 layer 900 within the IC substrate 600 shown in FIG. 6 in accordance with the present invention. A cross sectional view 902 of FIG. 9 indicates that all of the M3 layer 900, in the present invention, is basically ground to ensure a proper return path on the ground plane. In the conventional approach, the M3 layer is power.

Figure 10:
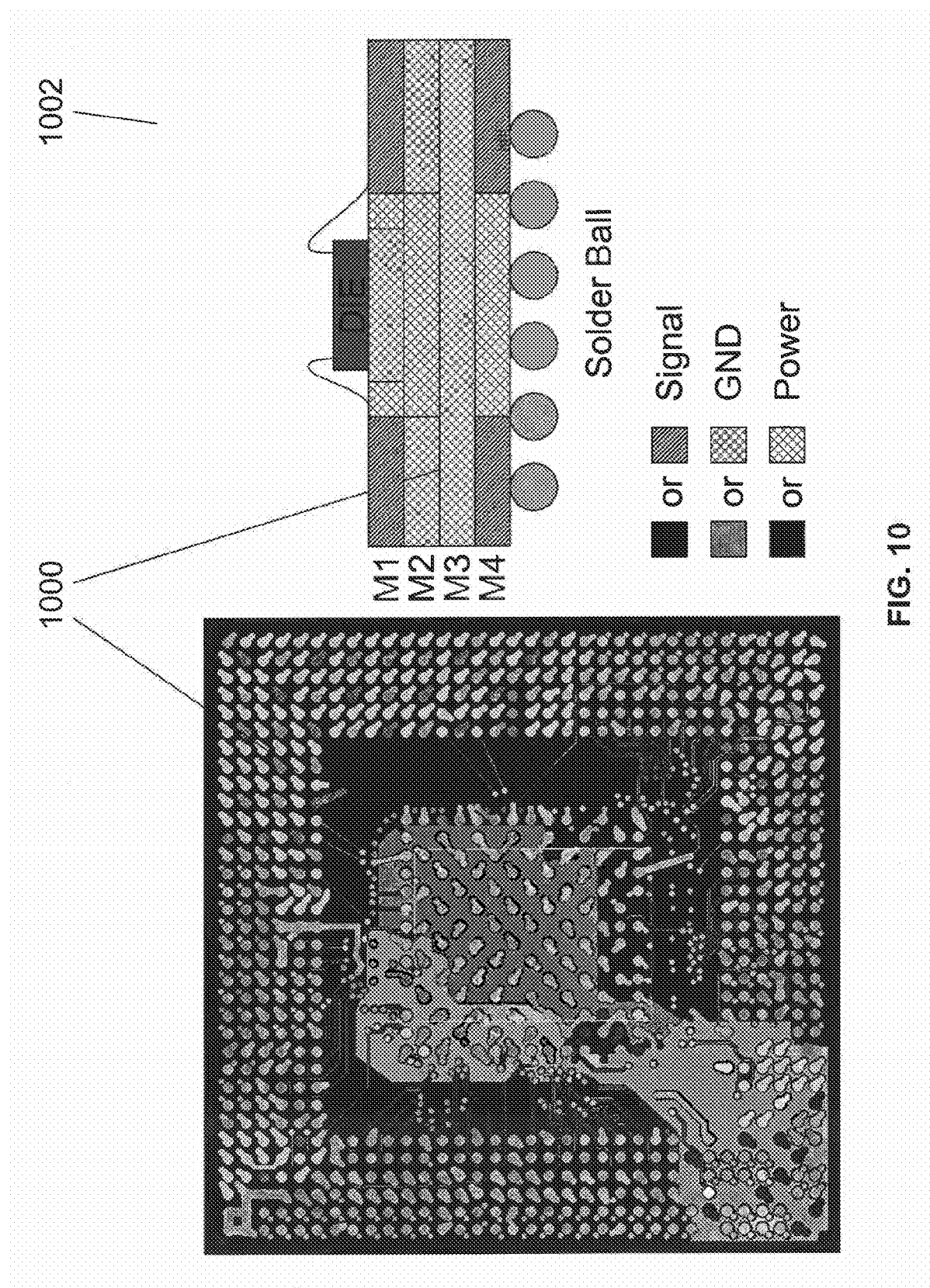
FIG. 10 is an illustration of the M4 layer of the IC substrate shown in FIG. 6 in accordance with the present invention.

FIG. 10 is an illustration of an M4 layer 1000 within the IC substrate 600 shown in FIG. 6 in accordance with the present invention. A cross-sectional view 1002 of FIG. 10 indicates that the M4 layer 1000 is a combination is signal and power. As noted above, the M4 layer includes receive differential pair circuits.

Figure 11:
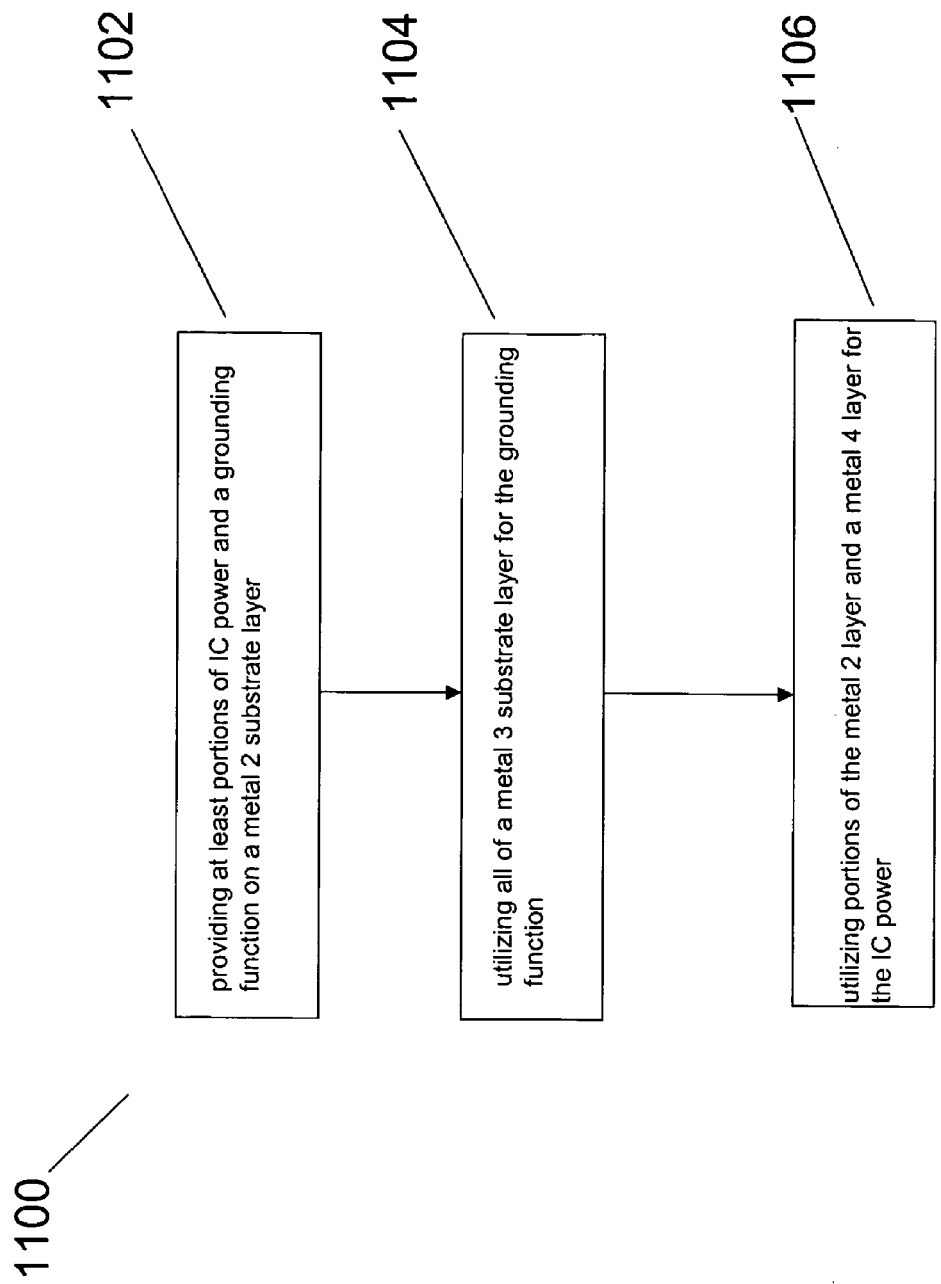
FIG. 11 is a flow diagram of an exemplary method of practicing an embodiment of the present invention.

FIG. 11 is an exemplary method 1100 of practicing an embodiment of the present invention. In FIG. 11, the method 1100 includes providing at least portions of IC power and a grounding function on a metal 2 substrate layer, as indicated in step 1102. All of a metal 3 substrate layer is utilized for the grounding function, as indicated in step 1104. In step 1106, portion of the metal 2 layer and a metal 4 layer are utilized for providing IC power.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method of forming an integrated circuit (IC) substrate including at least one die, the method comprising:
    forming a top metal layer of the substrate, a bottom metal layer of the substrate, and a plurality of intermediate metal layers between the top and bottom metal layers of the substrate, each respective metal layer having a center portion and a peripheral portion;
    configuring the peripheral portions of the top and bottom metal layers for a signal function; and
    configuring the peripheral portions of each intermediate metal layer for ground function;
    wherein all of the peripheral portions are devoid of a power function.

2. The method of claim 1, wherein all the successive metal layers are in direct contact without an intervening dielectric layer.

3. The method of claim 1, comprising:
    including active devices in the top and bottom metal layers.

4. The method of claim 1, the center portion being the area substantially under the die.

5. The method of claim 1, further comprising:
    configuring the top metal layer for the ground function.

6. The method of claim 1, further comprising:
    configuring the top metal layer for the power function.

7. The method of claim 1, further comprising:
    configuring at least one of said intermediate metal layers for the power function.

8. The method of claim 1, further comprising:
    configuring the bottom metal substrate layer for the power function.

* * * * *